(12) United States Patent
Kihara

(10) Patent No.: US 9,264,022 B2
(45) Date of Patent: Feb. 16, 2016

(54) LEVEL SHIFT CIRCUIT

(71) Applicant: SHARP KABUSHIKI KAISHA, Osaka-shi, Osaka (JP)

(72) Inventor: Seiichiro Kihara, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/761,052

(22) PCT Filed: Feb. 27, 2014

(86) PCT No.: PCT/JP2014/054837
§ 371 (c)(1),
(2) Date: Jul. 15, 2015

(87) PCT Pub. No.: WO2014/171190
PCT Pub. Date: Oct. 23, 2014

(65) Prior Publication Data
US 2015/0358003 A1    Dec. 10, 2015

(30) Foreign Application Priority Data

Apr. 18, 2013  (JP) ................................ 2013-087030

(51) Int. Cl.
*H03K 3/013* (2006.01)
*H03K 3/356* (2006.01)
*H03K 19/0185* (2006.01)

(52) U.S. Cl.
CPC ........ *H03K 3/356* (2013.01); *H03K 19/018507* (2013.01)

(58) Field of Classification Search
None
See application file for complete search history.

(56) References Cited

U.S. PATENT DOCUMENTS

| 8,957,721 B2* | 2/2015 | Kihara | H03K 3/356069 327/333 |
| 2011/0115542 A1 | 5/2011 | Koike | |
| 2014/0347116 A1* | 11/2014 | Kihara | H03K 3/356069 327/333 |

FOREIGN PATENT DOCUMENTS

| JP | 2011-109843 A | 6/2011 |
| JP | 2012-134791 A | 7/2012 |

OTHER PUBLICATIONS

International Search Report, issued in PCT/JP2014/054837, dated Apr. 8, 2014.

*Primary Examiner* — Long Nguyen
(74) *Attorney, Agent, or Firm* — Birch, Stewart, Kolasch & Birch, LLP

(57) ABSTRACT

Provided is a high-reliability level shift circuit not prone to faulty operation due to noise. A level shift circuit 1 is provided with: first and second current control elements 12a and 12b into control terminals of which a reverse-phase input signal and an in-phase input signal are input, respectively; first and second load circuits 13a and 13b which are connected at one end to a high-side power source terminal Vb and at the other end to each of first terminals of the first and second current control elements 12a and 12b; a comparator 14 in which a pair of differential input terminals Np and Nn are connected separately to each of the first terminals of the first and second current control elements 12a and 12b; a current generating circuit 3 in which first and second current output terminals Na and Nb are connected to second terminals of the first and second current control elements 12a and 12b, and which separately generates a current which flows through the respective first and second current control elements 12a and 12b; and voltage suppressing circuits 15a and 15b which are connected separately or commonly to the first and second current output terminals Na and Nb, respectively, and suppress voltage from rising in the first and second current output terminals Na and Nb, respectively.

5 Claims, 8 Drawing Sheets

LEVEL SHIFT CIRCUIT

CROSS-REFERENCE TO RELATED APPLICATIONS

This application is a National Phase filing under 35 U.S.C. §371 of International Application No. PCT/JP2014/054837 filed on Feb. 27, 2014, which claims priority under 35 U.S.C. 119(a) to Japanese Patent Application No. 2013-087030 filed on Apr. 18, 2013, all of which are hereby expressly incorporated by reference into the present application.

TECHNICAL FIELD

The present invention relates to a level shift circuit, and relates to a circuit that converts a voltage level of a control signal controlling a half-bridged switching element such as MOSFET, IGBT, SiCFET, or GaNFET, which is mainly used in an inverter circuit, to an appropriate level for the control.

BACKGROUND ART

An inverter system capable of high level control by a microcontroller has been widely used for controlling a motor which is used in household electrical appliances, such as an air conditioner or a refrigerator, in order to improve energy-saving performance. On the other hand, with practical use of a wide band gap semiconductor element such as SiCFET or GaNFET, application to an inverter circuit has been studied in an effort to aim efficiency improvement by low on-resistance and high frequency characteristics thereof.

FIG. 6 shows an example of a circuit configuration of a conventional inverter circuit. FIG. 6 is an example of a configuration of an inverter circuit INV which is configured with a driver circuit 30, power switching elements of an n-type MOSFET 7a and 7b, a diode 8, and a condenser 9. The driver circuit 30 has a function of a level shift circuit.

In the driver circuit 30, a power source terminal VCC and a ground terminal VSS which perform supplying externally, a control input terminal Inh on a high-side circuit 36 side, a control input terminal Inl on a low side, a positive voltage power source terminal Vb, a reference power source terminal Vs and an output terminal Vh on the high-side circuit 36 side, and an output terminal V1 on the low side are provided, respectively. The power source terminal VCC and the ground terminal VSS of the driver circuit 30 are connected to a power source terminal VCC and a ground terminal VSS of the inverter circuit INV, respectively.

A control input signal on the high-side circuit 36 side, which is input by the control input terminal Inh, is connected to an input terminal IN of a pulse generating circuit 31, and a first pulse with a pulse width of around 100 ns is generated from a first output terminal OUT1 after rising of the control input signal and a second pulse with a pulse width of around 100 ns is generated from a second output terminal OUT2 after falling of the control input signal, respectively.

FIG. 7 shows one example of a circuit configuration of the pulse generating circuit 31. The pulse generating circuit 31 is configured by including six inverters 41a, 41b, 41c, 41d, 41e and 41f which are cascade-connected, two NAND circuits 42a and 42b, two inverters 43a and 43b, and two condensers 44a and 44b for pulse width setting. An input of the head inverter 41a is connected to the input terminal IN, and when output nodes of the inverters 41a, 41b, 41c, 41d, 41e and 41f are set as N1, N2, N3, N4, N5 and N6 in order from head, respectively, one end each of the condensers 44a and 44b is grounded, the other ends thereof are connected to the nodes N3 and N4, respectively, the nodes N2 and N5 are connected to two inputs of the NAND circuit 42a, respectively, the nodes N1 and N6 are connected to two inputs of the NAND circuit 42b, respectively, outputs of the NAND circuits 42a and 42b are connected to inputs of the inverters 43a and 43b, respectively, and outputs of the inverters 43a and 43b are connected to the output terminals OUT1 and OUT2, respectively.

FIG. 8 shows an operation waveform of the pulse generating circuit 31. The first pulse in synchronization with the rising of the control input signal which is input to the input terminal IN and the second pulse in synchronization with falling thereof are output from the first output terminal OUT1 and the second output terminal OUT2, respectively.

The first pulse is input to a gate of an n-type high voltage MOSFET 32a, converted into a signal which is level-shifted by a resistance 33a, and input to a reset input R of an RS flip-flop 34. The second pulse is input to a gate of an n-type high voltage MOSFET 32b, converted into a signal which is level-shifted by a resistance 33b, and input to a set input S of the RS flip-flop 34. An output Q of the RS flip-flop 34 is connected to an input of an inverter 35, and an output of the inverter 35 is connected to a gate of the MOSFET 7a through the output terminal Vh.

As a result thereof, the control input signal which is input to the control input terminal Inh is level-shifted and transmitted to the high-side circuit 36 which is floating, and output to the gate of the MOSFET 7a as a high-side output signal. On the other hand, the control input signal on the low side, which is input to the control input terminal Inl on the low side, is output to a gate terminal of the MOSFET 7b through the output terminal V1 on the low side.

To a drain of the MOSFET 7a, a high-voltage power source of, for example, around 600 V is connected through a high-voltage power source terminal HV of the inverter circuit INV. A source of the MOSFET 7a and a drain of the MOSFET 7b are connected to the reference power source terminal Vs of the driver circuit 30 and an output terminal OUT of the inverter circuit INV, respectively. A source of the MOSFET 7b is connected to a ground terminal for output GND of the inverter circuit INV to be grounded.

One end of the condenser 9 is connected to a cathode terminal of the diode 8 and the positive voltage power source terminal Vb, the other end thereof is connected to the reference power source terminal Vs, and an anode terminal of the diode 8 is connected to the power source terminal VCC. A bootstrap circuit is configured by the diode 8 and the condenser 9. When the floating condenser 9 is charged with a power source voltage supplied through the power source terminal VCC of the inverter circuit INV which is connected to the power source terminal VCC and a potential of the reference power source terminal Vs rises through the MOSFET 7a, a high voltage is generated at the positive voltage power source terminal Vb due to electrostatic bonding through the condenser 9, so that floating power source supply is realized in the high-side circuit 36.

When two positive and reverse control input signals whose phases are inversed are input to the two control input terminals Inh and Inl, an output signal with a high voltage applied between the power source terminal HV and the ground terminal GND of the inverter circuit INV as an amplitude is generated on the output terminal OUT of the inverter circuit INV which is connected to the reference power source terminal Vs.

A reason why the pulse generating circuit 31 and the RS flip-flop 34 are used in the conventional circuit configuration shown in FIG. 6 is that power supplied by the bootstrap circuit to the condenser 9 is limited so that power consumption at the high-side circuit 36 is suppressed as much as possible to keep output capability of the inverter 35.

However, there is a problem that input of the RS flip-flop 34 is likely to be subjected to faulty operation with respect to noise, and countermeasure for noise is needed under a condition with much noise like the high-side circuit 36. Against such a problem, in PTL 1 described below, proposed is a circuit configuration in which a filter by a logic circuit is arranged before an RS flip-flop to prevent faulty operation due to noise.

Moreover, in PTL 2 described below, in order to provide a level shift circuit capable of suppressing faulty operation of an upper arm power switching element and an inverter device provided with the same, proposed is a method that in a series circuit of a resistance for generating an input signal of a power switching element driving circuit and an n-type MOSFET, each of the resistance and the n-type MOSFET is surrounded by double isolation oxide films and a potential of a Si active layer held between these double isolation oxide films is separately supplied. Specifically, with this method, when a time differentiation (dv/dt) of a low-level power source potential of the power switching element driving circuit which is connected to a source of the upper arm power switching element is generated, a voltage drop of this resistance is lowered to suppress faulty operation of the level shift circuit.

CITATION LIST

Patent Literatures

PTL 1: Japanese Unexamined Patent Application Publication No. 2011-109843
PTL 2: Japanese Unexamined Patent Application Publication No. 2012-134791

SUMMARY OF INVENTION

Technical Problem

However, since high dv/dt is generated on the output terminal of the inverter circuit, it is impossible to completely prevent faulty operation of the input terminal of the RS flip-flop of the high-side circuit due to noise caused by capacity coupling with not only the output terminal of the inverter circuit but the entire high-side circuit.

Moreover, since much higher dv/dt is generated when SiCFET or GaNFET capable of high-speed switching is used as the switching element, it is expected that it becomes more difficult to prevent faulty operation due to noise when usage of this high-speed switching element is assumed.

In order to solve the aforementioned problem, there is a method for cancelling noise generated by high dv/dt as an in-phase signal by using a comparator having a high in-phase signal removal ratio without using an RS flip-flop. In this case, in a conventional method using an RS flip-flop, current is consumed at the time of state transition under control by a reset signal, while in the method using the comparator, since it is necessary to flow current continuously at all times to keep an input voltage of the comparator continuously, current consumption generally increases compared to the conventional method using the RS flip-flop.

Further, in the method using the comparator, a phenomenon can occur that a high voltage which is boosted by a bootstrap circuit is temporarily divided and applied to a circuit which forms a voltage difference according to an input signal level between non-reverse input and reverse input of the comparator by flowing this current at all times. As a result thereof, this phenomenon causes a possibility that a high voltage is temporarily applied to the circuit in which this current at all times is generated, and further, noise is superimposed temporarily with differential input between the non-reverse input and the reverse input of the comparator, thus posing a problem that a high-side circuit becomes unable to control the power switching element.

In view of the aforementioned problems, an object of the present invention is to provide a high-reliability level shift circuit not prone to faulty operation due to noise.

Solution to Problem

In order to achieve the aforementioned object, the present invention provides a level shift circuit, including: a first current control element in which a reverse-phase input signal having a reverse phase to that of an input signal is input to a control terminal and a current amount flowing between first and second terminals is controlled based on voltage of the control terminal; a second current control element in which the input signal or an in-phase input signal which has a same phase as that of the input signal is input to a control terminal and a current amount flowing between first and second terminals is controlled based on voltage of the control terminal; a first load circuit which has one end connected to a high-side power source terminal and the other end connected to the first terminal of the first current control element, and generates a voltage drop according to a current amount flowing between both of the terminals; a second load circuit which has one end connected to the high-side power source terminal and the other end connected to the first terminal of the second current control element, and generates a voltage drop according to a current amount flowing between both of the terminals; a current generating circuit which has a first current output terminal connected to the second terminal of the first current control element and a second current output terminal connected to the second terminal of the second current control element, and separately generates a current which flows through each of the first current control element and the second current control element; a comparator in which one of a pair of differential input terminals is connected to the first terminal of the first current control element and the other of the pair of differential input terminals is connected to the first terminal of the second current control element, a power source voltage is supplied from the high-side power source terminal, and a reference voltage is supplied from a high-side reference terminal, and which generates an output signal according to a voltage difference between the pair of differential input terminals; and a voltage suppressing circuit which is connected to the first and second current output terminals separately or commonly and suppresses a voltage rise of each of the first and second current output terminals.

Further, it is preferable in the level shift circuit having the aforementioned feature that the voltage suppressing circuit is configured with a two-terminal circuit, and has one end of the two-terminal circuit connected to the first and second current output terminals separately or commonly and the other end of the second terminal circuit connected to a predetermined fixed potential, and has, between the one end and the other end of the two-terminal circuit, at least any one of circuit structures of a first circuit structure provided with a two-terminal switching element or a two-terminal switching circuit which becomes in a conductive state when voltage between the terminals exceeds a predetermined voltage and a second circuit structure in which a capacity element having an electric capacity larger than a capacity between respective terminals between the first terminal and the second terminal of the first and second current control elements is connected to the one end of the second terminal circuit.

Further, it is preferable in the level shift circuit having the aforementioned feature that the voltage suppressing circuit is configured by including at least one of a circuit including a single Zener diode or a series circuit of a plurality of Zener diodes, a circuit including a single diode or a series circuit of a plurality of diodes, a circuit including a series circuit of a diode and a voltage source, a circuit including a capacity element for suppressing voltage having an electric capacity larger than a capacity between respective terminals between the first terminal and the second terminal of the first and second current control elements, a circuit including a series circuit of the capacity element for suppressing voltage and a resistance element, and a circuit including a series circuit of a capacity element for suppressing voltage and a parallel circuit of a diode and a resistance element.

Further, it is preferable that the level shift circuit having the aforementioned feature further has a circuit power source terminal which receives a power source voltage for circuit operation from outside, a diode which is provided between the circuit power source terminal and the high-side power source terminal, a capacity element which is provided between the high-side power source terminal and the high-side reference terminal, and the high-side reference terminal and an output terminal of a high-voltage circuit which is driven by the output signal are electrically connected.

Further, it is preferable in the level shift circuit having the aforementioned feature that each of the first and second current control elements is configured by a high voltage MOSFET, the control terminal of each of the first and second current control elements is a gate of the MOSFET, and the first terminal and the second terminal of the first and second current control elements are a drain and a source of the MOSFET.

Further, the level shift circuit having the aforementioned feature is particularly preferable when the current generating circuit is configured by including a plurality of low-withstand-voltage current control elements, each of the plurality of low-withstand-voltage current control elements is provided with a first terminal, a second terminal and a control terminal, a current amount flowing between the first and second terminals is controlled based on voltage of the control terminal, a withstand voltage between the first and second terminals is lower than a withstand voltage between the first and second terminals of the first and second current control elements, the first terminal of one of the plurality of low-withstand-voltage current control elements is connected to the first current output terminal, and the first terminal of another one of the plurality of low-withstand-voltage current control elements is connected to the second current output terminal.

Further, it is preferable that the level shift circuit having the aforementioned feature is configured so that each terminal voltage of the high-side power source terminal and the high-side reference terminal changes so as to follow change in an output level of a high-voltage circuit which is driven by the output signal.

Advantageous Effects of Invention

In the level shift circuit having the aforementioned feature, when a high-side circuit configured by first and second load circuits and a comparator becomes in a floating state with respect to a reference voltage (ground voltage) of this level shift circuit and an output signal of the comparator shifts to a high level according to change in an input signal which is input to first and second current control elements, following the output level of the high-voltage circuit which is configured by a power switching element or the like driven by this output signal with an external bootstrap circuit, a high voltage supplied to the high-voltage circuit is applied to the high-side power source terminal to be level-shifted to a signal level needed for driving of this high-voltage circuit. Then, as a result of this level shift, a high voltage which is divided is to be applied also to each current output terminal of the current generating circuit through the first and second load circuits and the first and second current control elements from the high-side power source terminal. However, in this level shift circuit, since each current output terminal is provided with the voltage suppressing circuit which suppresses a voltage rise of this terminal, application of this high voltage which is divided is suppressed. As a result thereof, it is possible to prevent a possible damage of a circuit element configuring the current generating circuit, which is caused by application of the high voltage, as well as to prevent possible faulty operation of the high-side circuit due to change in a bias state of the first and second current control elements, which is caused with this voltage rise, thus making it possible to provide the high-reliability level shift circuit not prone to faulty operation due to noise.

DESCRIPTION OF EMBODIMENTS

Figure 6:
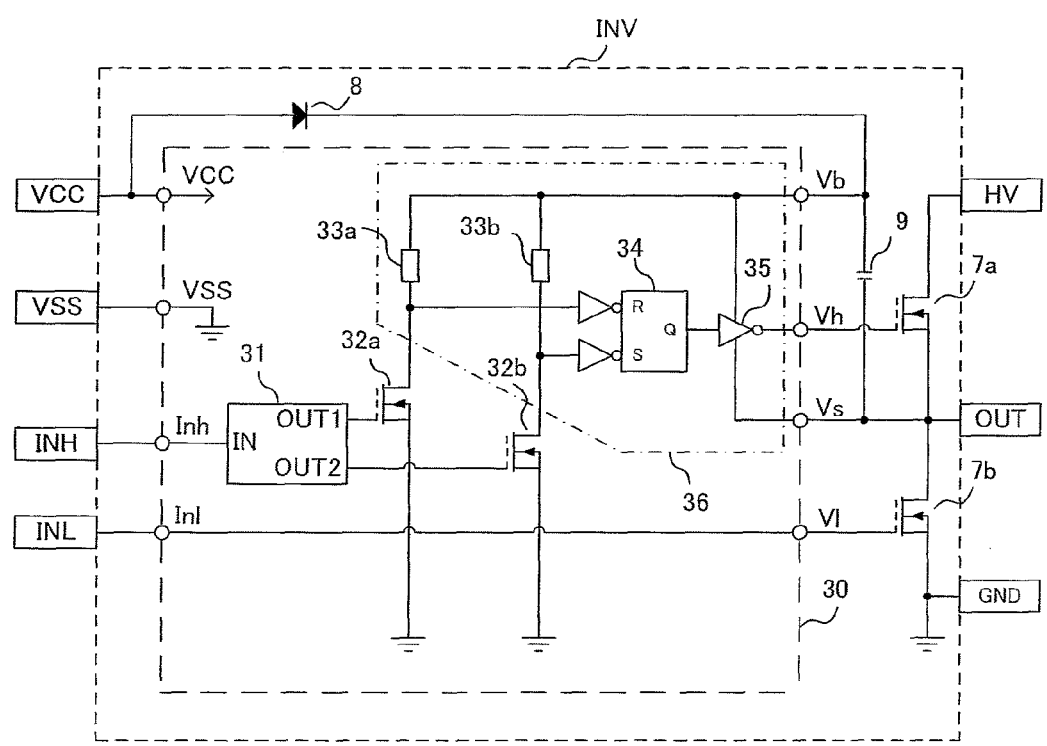
FIG. 6 is a circuit diagram showing an example of a circuit configuration of an inverter circuit including a conventional level shift circuit.
Figure 7:
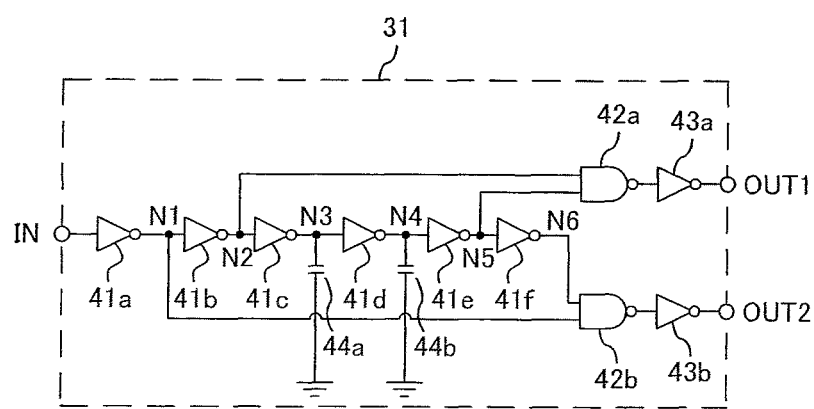
FIG. 7 is a circuit diagram showing an example of a circuit configuration of a pulse generating circuit used in the conventional level shift circuit shown in FIG. 6.
Figure 8:
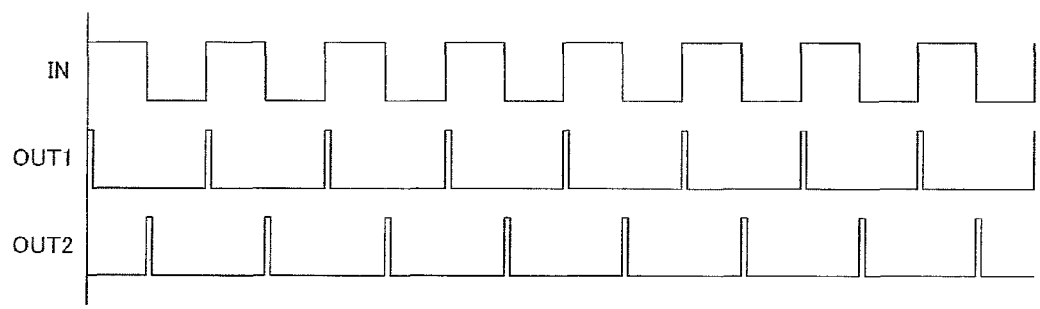
FIG. 8 is a signal waveform diagram of an input signal, and first and second pulses, which indicate operation of the pulse generating circuit shown in FIG. 7.

Description will be given below for a level shift circuit according to the present invention (hereinafter, referred to as "present invention circuit" as appropriate) with reference to drawings based on embodiments. Note that, in the present invention circuit described in each embodiment below, description will be given for elements in common with those of a conventional inverter circuit exemplified in FIG. 6 by giving same reference signs thereto even if having different names, in order to make the understanding of the description easier.

Figure 1:
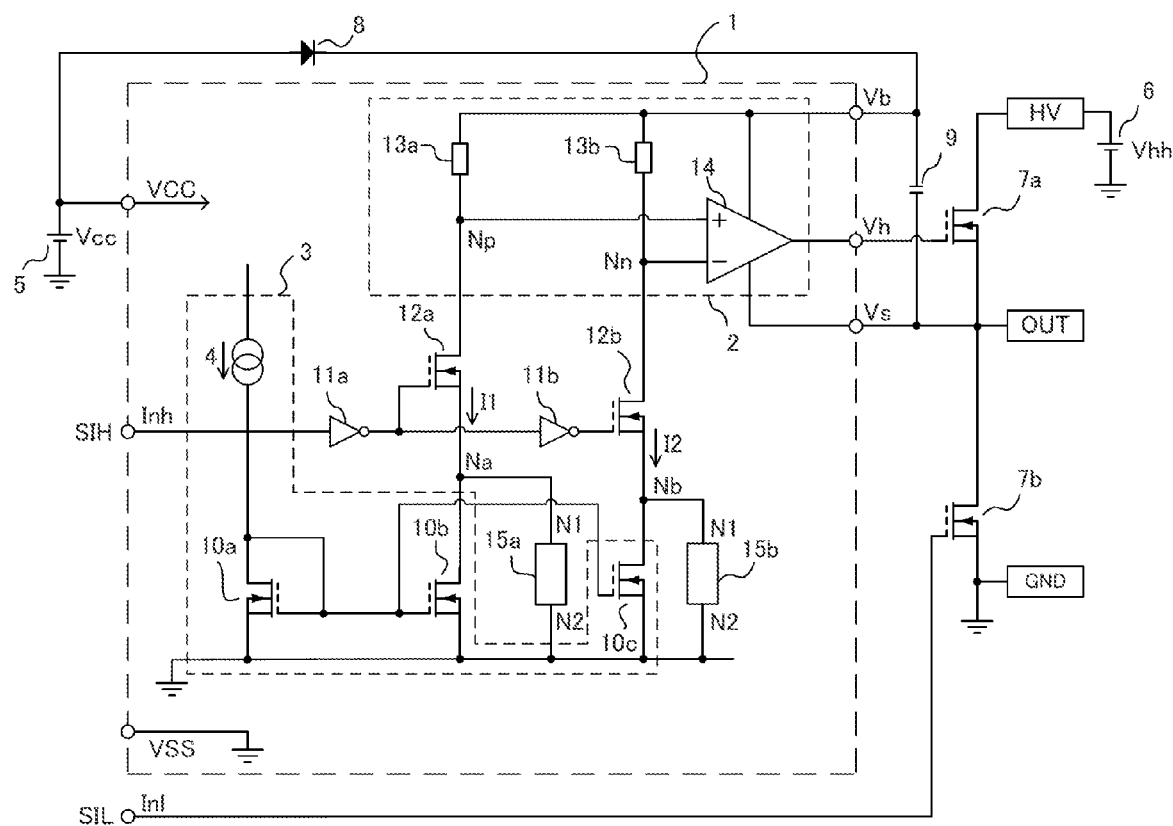
FIG. 1 is a circuit diagram showing one example of a circuit configuration of a level shift circuit according to the present invention.

FIG. 1 shows one example of a circuit configuration of the present invention circuit. The present invention circuit 1 is configured by including a high-side circuit 2, a current generating circuit 3, two inverters 11a and 11b, a pair of n-type high voltage MOSFETs 12a and 12b (corresponding to first and second current control elements), a pair of voltage suppressing circuits 15a and 15b, n-type high voltage MOSFETs 7a and 7b, a diode 8 and a condenser 9.

As shown in FIG. 1, a basic part of the present invention circuit 1 is configured by the high-side circuit 2, the current generating circuit 3, the two inverters 11a and 11b, and the pair of n-type high voltage MOSFETs 12a and 12b.

The high-side circuit 2 is configured by including a high-side power source terminal Vb, a high-side reference terminal Vs, a high-side output terminal Vh, a pair of resistance elements 13a and 13b (corresponding to first and second load circuits), and a comparator 14. One end of each of the resistance elements 13a and 13b is connected to the high-side power source terminal Vb, the other end of the resistance element 13a is connected to a non-reverse input terminal Np of the comparator 14, and the other end of the resistance element 13b is connected to a reverse input terminal Nn of the comparator 14. The comparator 14 has a power source voltage supplied from the high-side power source terminal Vb and has a reference voltage supplied from the high-side reference terminal Vs, and outputs a high-side output signal which is level-shifted from the high-side output terminal Vh according to a voltage difference between the non-reverse input terminal Np and the reverse input terminal Nn. The comparator 14 is a differential circuit having the non-reverse input terminal Np and the reverse input terminal Nn as a differential input terminal pair, and therefore has a high in-phase signal removal ratio with respect to in-phase noise which is caused by dv/dt, thus having high resistance to faulty operation resulting from the in-phase noise.

The current generating circuit 3 is configured by a constant current circuit 4, and n-type MOSFETs 10a, 10b and 10c. One end of the constant current circuit 4 is connected to, for example, a circuit power source terminal VCC, and the other end of the constant current circuit 4 and each gate of the MOSFETs 10a, 10b and 10c are connected to a drain of the MOSFET 10a. Each source of the MOSFETs 10a, 10b and 10c is connected to a circuit reference terminal VSS. A drain of the MOSFET 10b is connected to a first current output terminal Na, and a drain of the MOSFET 10c is connected to a second current output terminal Nb. Thereby, a first current mirror circuit is configured by the n-type MOSFETs 10a and 10b, and a second current mirror circuit is configured by the n-type MOSFETs 10a and 10c, and a current which is almost same as a current Is supplied from the constant current circuit 4 flows to the circuit reference terminal VSS though the MOSFETs 10b and 10c from the first and second current output terminals Na and Nb, respectively.

An input of the inverter 11a is connected to a control input terminal Inh, an output of the inverter 11a is connected to an input of the inverter 11b and a gate of the MOSFET 12a, and an output of the inverter 11b is connected to a gate of the MOSFET 12b. Thereby, a reverse-phase input signal with a reverse phase to that of a high-side input signal SIH which is input to the control input terminal Inh is input to the gate of the MOSFET 12a and an in-phase input signal with a same phase as that of the high-side input signal SIH is input to the gate of the MOSFET 12b.

A drain of the MOSFET 12a is connected to the other end of the resistance element 13a and the non-reverse input terminal Np of the comparator 14, a drain of the MOSFET 12b is connected to the other end of the resistance element 13b and the reverse input terminal Nn of the comparator 14, a source of the MOSFET 12a is connected to the first current output terminal Na and a source of the MOSFET 12b is connected to the second current output terminal Nb.

In the present embodiment, as the pair of n-type MOSFET 12a and 12b and the pair of resistance elements 13a and 13b, ones having same electric characteristics between elements forming each pair. The resistance elements 13a and 13b may be made of any materials and have any element structures, and further may not be necessarily single element, as long as elements causing a voltage drop by current flowing therethrough.

A positive electrode of a voltage source 5 which supplies a power source voltage Vcc for low-voltage circuit operation to the present invention circuit 1 is connected to the circuit power source terminal VCC, and a reference voltage Vss (ground voltage=0 V) is supplied to the circuit reference terminal VSS from outside.

A drain of the high voltage MOSFET 7a is connected to a positive electrode of a high-voltage source 6 which supplies a high power source voltage Vhh, a source of the high voltage MOSFET 7a is connected to a drain of the high voltage MOSFET 7b to form a high-voltage output terminal OUT, and a source of the high voltage MOSFET 7b is connected to a reference voltage Vss (ground voltage=0 V). A high-side output signal which is output from the high-side output terminal Vh is input to a gate of the high voltage MOSFET 7a, and a low-side input signal SIL with a reverse phase to that of the high-side input signal SIH is input to a gate of the high voltage MOSFET 7b. Moreover, the high voltage output terminal OUT and the high-side reference terminal Vs are connected, and a voltage level of the high-side reference terminal Vs changes following an output voltage level output from the high-voltage output terminal OUT. That is, the high-side circuit 2 is a floating circuit whose reference voltage level changes when viewed from the circuit reference terminal VSS.

An anode of the diode 8 is connected to the circuit power source terminal VCC, a cathode of the diode 8 and one end of the condenser 9 are connected to the high-side power source terminal Vb, and the other end of the condenser 9 is connected to the high-side reference terminal Vs, so that a bootstrap circuit is configured. Thereby, a terminal voltage of the high-side power source terminal Vb is supplied from the circuit power source terminal VCC through the diode 8 when the output voltage level output from the high-voltage output terminal OUT is at a low level. On the other hand, when this output voltage level shifts to a high level, a terminal voltage of the high-side reference terminal Vs also shifts in the same manner, and the terminal voltage of the high-side power source terminal Vb is boosted exceeding a terminal voltage of the circuit power source terminal VCC following this change in the output voltage level through the condenser 9. This boosted terminal voltage of the high-side power source terminal Vb is not radiated to a side of the circuit power source terminal VCC by the diode 8 in a reverse bias state and keeps a high voltage state. Moreover, since this boosted terminal voltage of the high-side power source terminal Vb is supplied as a power source voltage to the comparator 14, an output level of the high-side output signal output from the high-side output terminal Vh is also boosted in the same manner. Accordingly, the high-side circuit 2 is configured as a floating circuit, thus making it possible to drive a gate voltage of the high voltage MOSFET 7a to a sufficiently high voltage in cooperation with the bootstrap circuit.

The pair of voltage suppressing circuits 15a and 15b suppress terminal voltages of the first and second current output terminals Na and Nb of the current generating circuit 3 from rising excessively during circuit operation. This prevents excess stress from being applied to the MOSFETs 10b and 10c which are connected to the current output terminals Na and Nb, respectively. The voltage suppressing circuits 15a and 15b will be described below in detail.

Figure 2:
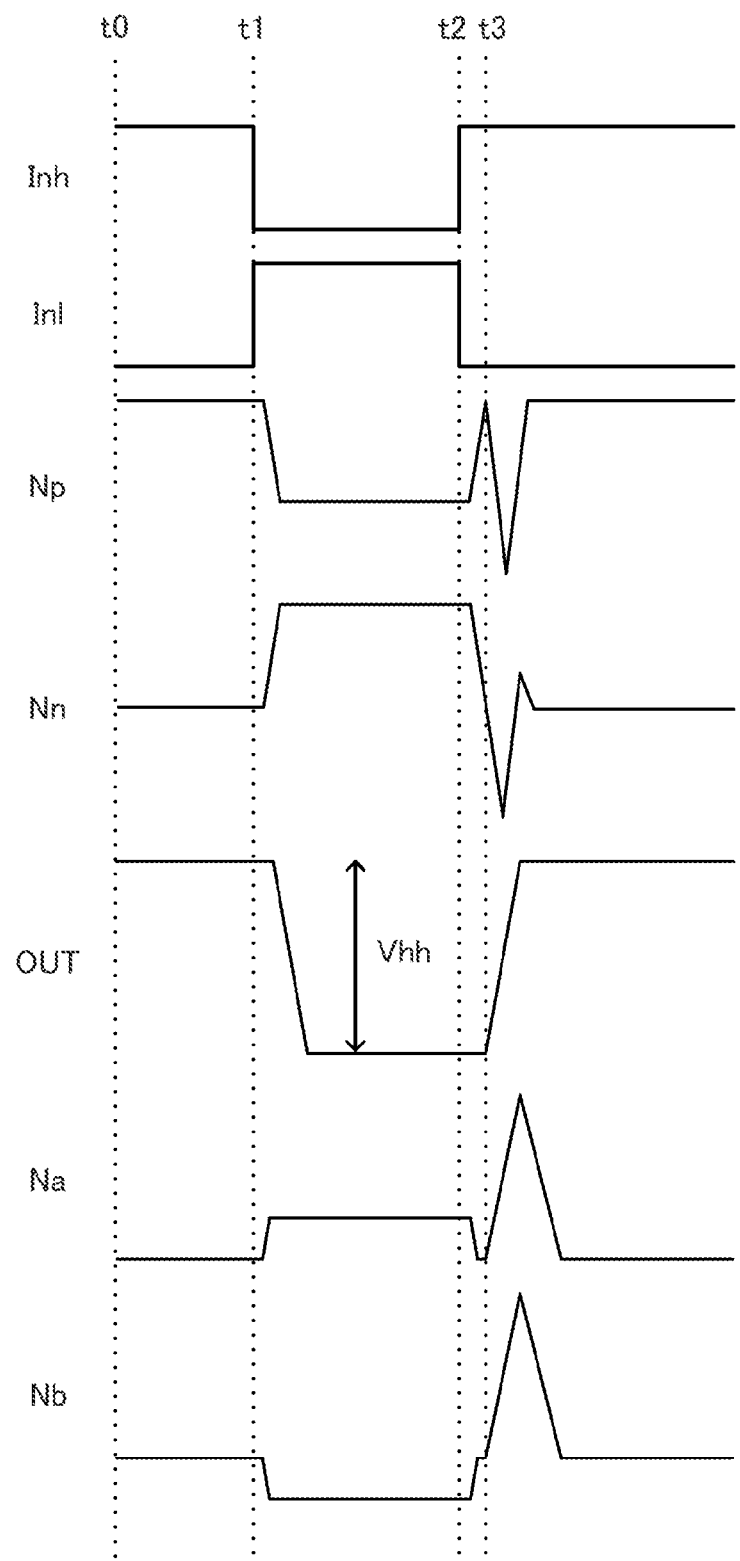
FIG. 2 is a voltage waveform diagram showing main change in a terminal voltage when voltage suppressing circuits are not provided in circuit operation of the level shift circuit shown in FIG. 1.

Next, description will be given for circuit operation of the present invention circuit 1. First, description will be given for operation in a case without the pair of voltage suppressing circuits 15a and 15b with reference to a voltage waveform diagram shown in FIG. 2. In FIG. 2, each voltage waveform of the high-side input signal SIH, the low-side input signal SIL, the non-reverse input terminal Np, the reverse input terminal Nn, the high-voltage output terminal OUT, the first current output terminal Na and the second current output terminal Nb is schematically shown in order from an upper stage. Note that, a voltage value shown in FIG. 2 does not correctly show a value in proportion to a voltage value in actual circuit operation, but schematically shows an outline of voltage change. Note that, each voltage of the high-side input signal SIH, the low-side input signal SIL, the high-voltage output terminal OUT, the first current output terminal Na, and the second current output terminal Nb is voltage with the circuit reference terminal VSS as a reference and each voltage of the non-reverse input terminal Np and the reverse input terminal Nn is voltage with the high-side reference terminal Vs as a reference.

As shown in FIG. 2, at a time t0, the high-side input signal SIH is at a high level, the low-side input signal SIL is at a low level, the high voltage MOSFET 7a is in an on state and the high voltage MOSFET 7b is in an off state, and as described below, the high voltage Vhh is output to the high-voltage output terminal OUT. In such a stationary state (state H), the MOSFET 12a has the gate applied with the reference voltage Vss at a low level to be in the off state and the MOSFET 12b has the gate applied with the power source voltage Vcc at a high level to be in the on state. In this state, a current I2 flowing through the MOSFET 10c of the current generating circuit 3 flows through the MOSFET 12b and the resistance element 13b, and a voltage drop ΔV2 according to the current I2 is caused in both ends of the resistance element 13b. On the other hand, since the MOSFET 12a is in the off state, no current flows through the resistance element 13a and a voltage drop ΔV1 between both ends of the resistance element 13a is 0 V.

Moreover, in this stationary state, since the MOSFET 12a is in the off state and a current I1 flowing through the MOSFET 10b is zero, the terminal voltage of the first current output terminal Na is the reference voltage Vss (ground voltage=0 V). On the other hand, the MOSFET 12b is in the on state and voltage between the gate and the source of the MOSFET 12b is automatically adjusted so that a current same as the current I2 flowing through the MOSFET 10c flows, so that the terminal voltage of the second current output terminal Nb becomes this adjusted source voltage of the MOSFET 12b.

Since the high-side circuit 2 operates as the floating circuit, the voltage of the high-side power source terminal Vb is voltage which is obtained by adding voltage Vα which is nearly equal to voltage, which is obtained by subtracting a voltage drop amount of the diode 8 from the power source voltage Vcc, to the output voltage Vhh of the high-voltage output terminal OUT (Vhh+Vα). On the other hand, the voltage of the high-side power source terminal Vb is also the output voltage Vhh of the high-voltage output terminal OUT. Accordingly, when the high-side power source terminal Vb serves as the reference, the voltage of the non-reverse input terminal Np becomes nearly equal to the voltage Vα of the high-side power source terminal Vb and the voltage of the reverse input terminal Nn becomes nearly equal to voltage which is obtained by subtracting the voltage drop ΔV2 of the resistance element 13b from the voltage Vu of the high-side power source terminal Vb (Vα−ΔV2). Thus, since the voltage of the non-reverse input terminal Np becomes higher than the voltage of the reverse input terminal Nn, the high-level voltage (Vα) with the high-side reference terminal Vs as a reference is output from the comparator 14, and by setting the voltage Vα to be higher than a threshold voltage of the high voltage MOSFET 7a, the high voltage Vhh is output to the high-voltage output terminal OUT as shown in FIG. 2.

Subsequently, assumed is a case where the high-side input signal SIH shifts from the high level to the low level at a time t1. When the high-side input signal SIH shifts to the low level, the MOSFET 12a has the gate applied with the high-level voltage Vcc to be changed from the off state to the on state, and the MOSFET 12b has the gate applied with the low-level voltage Vss to be changed from the on state to the off state. As a result thereof, the current I1 flowing through the MOSFET 10b of the current generating circuit 3 flows through the MOSFET 12a and the resistance element 13a, and the voltage drop ΔV1 according to the current I1 is caused in the both ends of the resistance element 13a. On the other hand, since the MOSFET 12b becomes in the off state, no current flows through the resistance element 13b and a voltage drop ΔV2 between the both ends of the resistance element 13b is 0 V.

On the other hand, since the low-side input signal SIL shifts from the low level to the high level at the time t1, the high voltage MOSFET 7b becomes in the on state from the off state and the voltage level of the high-voltage output terminal OUT starts to drop from the high voltage Vhh. Following it, each voltage of the high-side power source terminal Vb and the high-side reference terminal Vs of the high-side circuit 2 also drops. However, since the aforementioned voltage drop ΔV1 and voltage drop ΔV2 when viewed from the high-side power source terminal Vb are kept, the voltage of the non-reverse input terminal Np is lower than the voltage of the reverse input terminal Nn, so that a low-level voltage (0 V) is output from the comparator 14 with the high-side reference terminal Vs as a reference. As a result thereof, voltage between the gate and the source of the high voltage MOSFET 7a becomes at a low level to shift from the on state to the off state. Then, the voltage level of the high-voltage output terminal OUT finally drops to the reference voltage Vss (ground voltage=0 V). Moreover, the voltage of the high-side reference terminal Vs also becomes the reference voltage Vss (ground voltage=0 V), and the voltage of the high-side power source terminal Vb drops only by the voltage nearly same as the voltage change amount (Vhh) of the high-voltage output terminal OUT from the voltage in the state H (Vhh+Vα) to drop to the voltage Vα. Thereby, each voltage of the non-reverse input terminal Np and the reverse input terminal Nn becomes voltage (Vα−ΔV1) and the voltage Vα, respectively.

Further, since the MOSFET 12a becomes in the on state from the off state, voltage between the gate and the source of the MOSFET 12a is automatically adjusted so that a current same as the current I1 flowing through the MOSFET 10b flows, and the terminal voltage of the first current output terminal Na rises to this adjusted source voltage of the MOSFET 12a from the reference voltage Vss (ground voltage=0 V). On the other hand, since the MOSFET 12b becomes in the off state, the current I2 flowing through the MOSFET 10c is zero and that of the second current output terminal Nb drops to the reference voltage Vss (ground voltage=0 V).

Subsequently, assumed is a case where the high-side input signal SIH shifts from the low level to the high level and the low-side input signal SIL shifts from the high level to the low level at a time t2.

First, the low-side input signal SIL becomes at a low level and the high voltage MOSFET 7b becomes in the off state. Since the high-side input signal SIH becomes at a high level, the MOSFET 12a has the gate applied with the reference voltage Vss at a low level to be in the off state and the MOSFET 12b has the gate applied with the power source voltage Vcc at a high level to be in the on state. As a result thereof, the current I2 flowing through the MOSFET 10c of the current generating circuit 3 flows through the MOSFET 12b and the resistance element 13b, and the voltage drop $\Delta V2$ according to the current I2 is caused in the both ends of the resistance element 13b. On the other hand, since the MOSFET 12a becomes in the off state, no current flows through the resistance element 13a and the voltage drop $\Delta V1$ between the both ends of the resistance element 13a becomes 0 V.

Immediately following the time t2, the voltage of the high-side power source terminal Vb drops to a voltage state (voltage V$\alpha$) of a stationary state (state L) immediately preceding the time t2, and the voltage of the high-side reference terminal Vs also drops to a voltage state of the state L immediately preceding the time t2 (reference voltage Vss=0 V). Thus, the voltage of the non-reverse input terminal Np becomes nearly equal to the voltage V$\alpha$ of the high-side power source terminal Vb and the voltage of the reverse input terminal Nn becomes nearly equal to voltage which is obtained by subtracting the voltage drop $\Delta V2$ of the resistance element 13b from the voltage V$\alpha$ of the high-side power source terminal Vb (V$\alpha$–$\Delta V2$). Note that, respective voltages of the non-reverse input terminal Np and the reverse input terminal Nn have a same voltage value even with the circuit reference terminal VSS as a reference.

As a result of the above, since the voltage of the non-reverse input terminal Np becomes higher than the voltage of the reverse input terminal Nn, the high-level voltage (V$\alpha$) with the high-side reference terminal Vs as a reference is output from the comparator 14, and the high voltage MOSFET 7a becomes in the on state. A time point when the high voltage MOSFET 7a becomes in the on state is set as a time t3 below. When the high voltage MOSFET 7a becomes in the on state at the time t3 slightly behind the time t2, the high voltage MOSFET 7b is in the off state, so that the voltage level of the high-voltage output terminal OUT rises. Each voltage of the high-side power source terminal Vb and the high-side reference terminal Vs also rises in the same manner following this voltage rise, so that the voltage between the gate and the source of the high voltage MOSFET 7a in the on state is kept to have the voltage V$\alpha$ higher than the threshold voltage, and the voltage level of the high-voltage output terminal OUT rises to the high voltage Vhh.

Here, the voltage of the high-side reference terminal Vs completely follows the voltage level of the high-voltage output terminal OUT and the voltage change of the high-side power source terminal Vb also follows the voltage change of the high-voltage output terminal OUT by electrostatic bonding though the condenser 9 nearly promptly. Since the MOSFET 12a is in the off state, the voltage of the non-reverse input terminal Np does not cause a voltage drop by the resistance element 13a and has a voltage rise following the voltage change in the high-side power source terminal Vb, but a time delay according to a time constant which is expressed by a capacity parasitic to the non-reverse input terminal Np and a product of resistance values of the resistance element 13a is caused. On the other hand, since the MOSFET 12b is in the on state, the voltage of the reverse input terminal Nn has a voltage rise following the voltage change in the high-side power source terminal Vb with the voltage drop amount ($\Delta V2$) by the resistance element 13b subtracted, but a time delay according to a time constant which is expressed by a capacity parasitic to the reverse input terminal Nn and a product of resistance values of the resistance element 13b is caused. As a result of these time delays, when the high-side reference terminal Vs serves as the reference, each voltage of the non-reverse input terminal Np and the reverse input terminal Nn becomes a negative voltage temporarily, but a magnitude relation of the voltage between the non-reverse input terminal Np and the reverse input terminal Nn is kept after the time t3 as well, so that the output voltage of the comparator 14 is kept at the voltage V$\alpha$.

When the circuit reference terminal VSS serves as the reference, respective voltages of the non-reverse input terminal Np and the reverse input terminal Nn have the magnitude relation reversed, which become the voltage V$\alpha$ and the voltage (V$\alpha$–$\Delta V2$) immediately following the time t2 which have been the voltage (V$\alpha$–$\Delta V1$) and the voltage V$\alpha$ at the time t2, and after the time t3, which rise to voltage (Vhh+V$\alpha$) and voltage (Vhh+V$\alpha$–$\Delta V2$), respectively.

Here, though the MOSFET 12a is in the off state, there is a large parasitic capacity between the drain and the source of the high voltage MOSFET 12a, and further, this capacity between the drain and the source is considerably large compared to a parasitic capacity excluding this capacity between the drain and the source within a parasitic capacity of the first current output terminal Na on the source side of the MOSFET 12a (for example, about ten to one hundred times or more), so that the voltage of the first current output terminal Na also rises rapidly from the voltage state (reference voltage Vss=0 V) immediately preceding the time t3 by electrostatic bonding thorough this capacity between the drain and the source with the voltage rise of the non-reverse input terminal Np. Since the MOSFET 10b which is connected to the first current output terminal Na is made conductive with the voltage rise of the first current output terminal Na, the voltage of the first current output terminal Na, which has risen once, finally drops to the original voltage state (reference voltage Vss=0 V).

On the other hand, while the MOSFET 12b and the MOSFET 10c are in the on states and the current I2 flows therethrough, a large parasitic capacity exists between the drain and the source of the high voltage MOSFET 12b, and further, this capacity between the drain and the source is considerably large compared to a parasitic capacity excluding this capacity between the drain and the source within a parasitic capacity of the second current output terminal Nb on the source side of the MOSFET 12b (for example, about ten to one hundred times or more), so that, with the voltage rise of the reverse input terminal Nn, the voltage of the second current output terminal Nb also rises rapidly from the voltage state immediately preceding the time t3 (the source voltage of the MOSFET 12b through which the current I2 flows) against the current I2 flowing through the MOSFET 10c by electrostatic bonding thorough this capacity between the drain and the source. Since the MOSFET 10c which is connected to the second current output terminal Nb is in the on state, the voltage of the second current output terminal Nb, which has risen once, finally drops to the aforementioned original voltage state. Note that, in a time period during which the voltage of the second current output terminal Nb becomes higher than voltage which is lower than gate voltage of the MOSFET 12b (power source voltage Vcc) by a threshold voltage amount of the MOSFET 12b, the MOSFET 12b which is originally in the on state is in the off state. That is, the state is such that the voltage with respect to the reverse input terminal Nn is not driven by the MOSFET 12b, and there is a risk that operation of the comparator 14 becomes likely to be affected by noise temporarily to be unstable.

Summarizing the above, since operation in a period until the subsequent stationary state (state L) is reached through a transient state immediately following the time t1 after the stationary state (state H) immediately preceding the time t1 is that the output voltage of the high-voltage output terminal OUT drops from the high voltage Vhh to the reference voltage Vss (ground voltage=0 V), a phenomenon does not occur that the terminal voltages of the first and second current output terminals Na and Nb rise excessively. Against this, when, from the state L immediately preceding the time t2, the high-side input signal SIH shifts from the low level to the high level and the low-side input signal SIL shifts from the high level to the low level at the time t2, the voltage level of the high-voltage output terminal OUT rises from the voltage state immediately preceding the time t2 (reference voltage Vss=0 V) after the time t3, so that each voltage of the non-reverse input terminal Np and the reverse input terminal Nn also rises following this. As a result thereof, by electrostatic bonding through the capacity between the drain and the source of each of the MOSFETs 12a and 12b, each voltage of the first and second current output terminals Na and Nb rises temporarily, and after a predetermined time has elapsed, drops to the voltage state immediately preceding the time t3. That is, a phenomenon occurs that the terminal voltages of the first and second current output terminals Na and Nb rise excessively.

As described above, in the case without the voltage suppressing circuits 15a and 15b, since the phenomenon can occur that the terminal voltages of the first and second current output terminals Na and Nb rise excessively, by providing the voltage suppressing circuits 15a and 15b, it becomes possible to suppress the excessive rise of these terminal voltages.

Next, description will be given for a specific example of a circuit configuration of the voltage suppressing circuits 15a and 15b. In the present embodiment, each of the voltage suppressing circuits 15a and 15b is configured with a two-terminal circuit, and one end of this two-terminal circuit (first terminal N1) is connected to the first and second current output terminals Na and Nb separately, and the other end of this two-terminal circuit (second terminal N2) is connected to the circuit reference terminal VSS.

The voltage suppressing circuits 15a and 15b have at least any one of circuit structures among a first circuit structure and a second circuit structure as follows.

The first circuit structure is configured by including, between the first and second terminals N1 and N2, a two-terminal switching element or a two-terminal switching circuit which becomes in a conductive state when voltage between the terminals exceeds a predetermined voltage.

As described above, in the stationary state of the state H, the MOSFET 12b is in the on state and the voltage between the gate and the source of the MOSFET 12b is automatically adjusted so that a current same as the current I2 flowing through the MOSFET 10c flows, so that the terminal voltage of the second current output terminal Nb becomes this adjusted source voltage of the MOSFET 12b. In the same manner, in the stationary state of the state L, the MOSFET 12a is in the on state and the voltage between the gate and the source of the MOSFET 12a is automatically adjusted so that a current same as the current I1 flowing through the MOSFET 10b flows, so that the terminal voltage of the first current output terminal Na becomes this adjusted source voltage of the MOSFET 12a. Therefore, in the voltage suppressing circuits 15a and 15b with the first circuit structure, a turn-on voltage of the aforementioned two-terminal switching element or two-terminal switching circuit is set so that conduction is given between the first and second terminals N1 and N2 when one of the voltages of the first and second current output terminals Na and Nb rises over a predetermined reference voltage which is set to be higher than the source voltages of the MOSFET 12a and 12b in each stationary state described above.

Thereby, by providing the voltage suppressing circuits 15a and 15b of the first circuit structure, it is possible to suppress the excessive rise of the terminal voltages of the first and second current output terminals Na and Nb without blocking circuit operation of the present invention circuit 1.

The second circuit structure is configured such that one end of a condenser having an electric capacity larger than the capacity between the drain and the source of the high voltage MOSFETs 12a and 12b is connected to the first terminal N1 and the other end thereof is connected to the second terminal N2 directly or through a low-impedance element or a circuit.

As described above, in a transient period during which the high-side input signal SIH shifts from the low level to the high level and the voltage level of the high-voltage output terminal OUT rises from the reference voltage Vss (=0 V) to the high voltage Vhh, each voltage of the non-reverse input terminal Np and the reverse input terminal Nn also rises following this voltage rise, and further, by electrostatic bonding through the capacity between the drain and the source of each of the MOSFETs 12a and 12b, each voltage of the first and second current output terminals Na and Nb rises temporarily. Thus, the parasitic capacities of the first and second current output terminals Na and Nb become larger than the capacity between the drain and the source of each of the MOSFETs 12a and 12b by providing the voltage suppressing circuits 15a and 15b of the second circuit structure, so that the excessive voltage rise of the first and the second current output terminals Na and Nb by the aforementioned electrostatic bonding is suppressed by an electric charge distribution effect to the condensers of the voltage suppressing circuits 15a and 15b.

Figure 3:
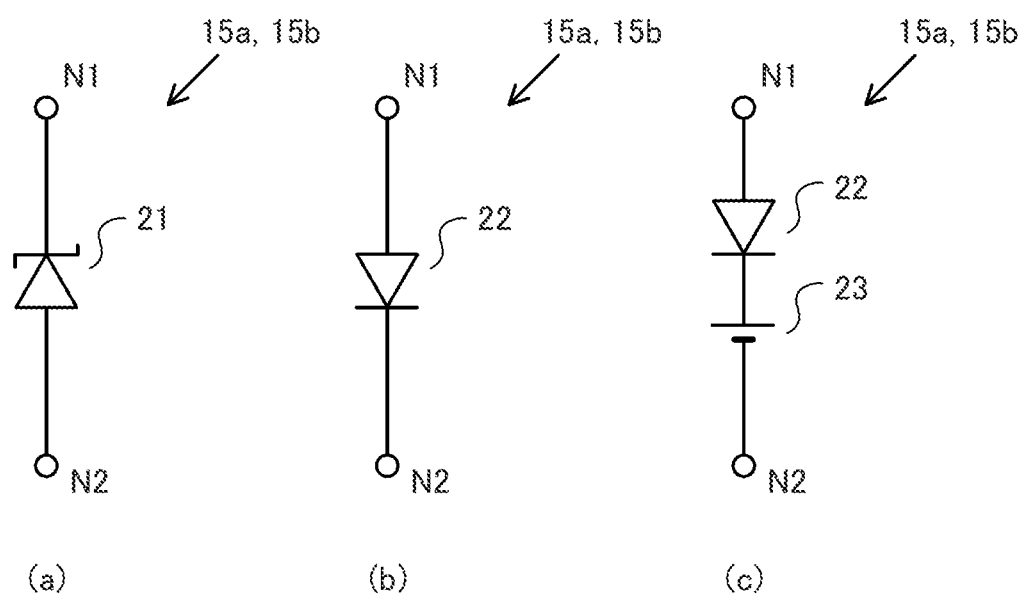
FIG. 3 is a circuit diagram showing an example of a circuit configuration of a first circuit structure of the voltage suppressing circuits shown in FIG. 1.

FIG. 3 shows an example of a circuit configuration of the voltage suppressing circuits 15a and 15b of the first circuit structure. In the example of the circuit configuration shown in FIG. 3, exemplified is a case where the two-terminal switching element described above is configured with a Zener diode 21 and a diode 22. Moreover, as the two-terminal switching circuit described above, a series circuit of the Zener diode or the diode, a series circuit of the Zener diode 21 or the diode 22 and a constant voltage source 23, or the like is usable. Note that, the two-terminal switching element is not limited to the Zener diode 21 nor the diode 22, and any switching element is able to be utilized as long as a current flows when voltage between two terminals exceeds a fixed threshold voltage whether a direction in which a current flows is a one-way direction or a two-way direction. Moreover, the diode 22 is not limited to a PN junction diode, and ones with various forms are able to be utilized.

Figure 4:
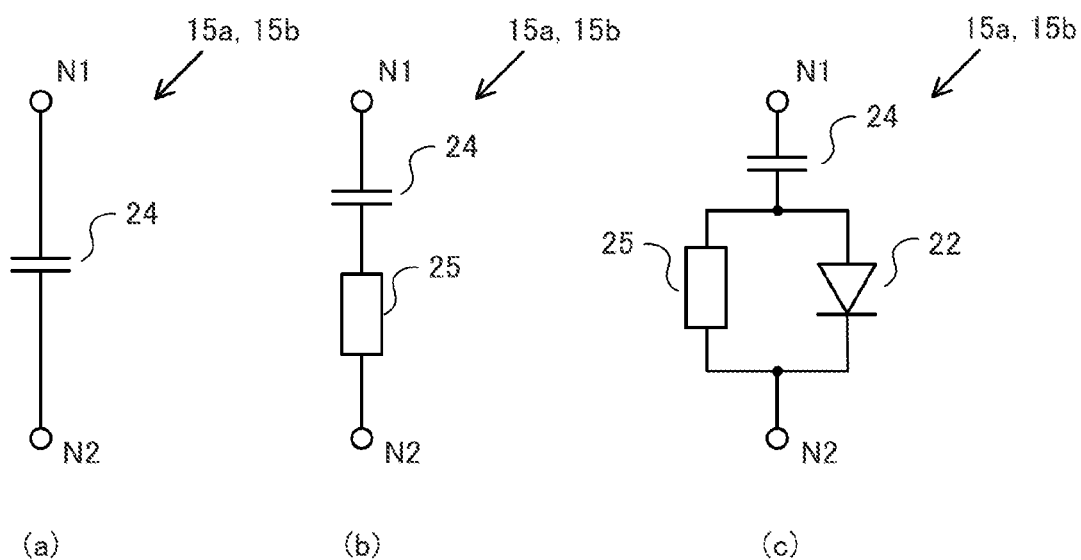
FIG. 4 is a circuit diagram showing an example of a circuit configuration of a second circuit structure of the voltage suppressing circuits shown in FIG. 1.

FIG. 4 shows an example of a circuit configuration of the voltage suppressing circuits 15a and 15b of the second circuit structure. In the example of the circuit configuration of FIG. 4, exemplified are a case of a configuration with a single condenser 24 having an electric capacity larger than the capacity between the drain and the source of the MOSFETs 12a and 12b, a case of configuration with a series circuit in which a resistance element 25 is in series with this condenser 24, and a configuration with a series circuit in which a parallel circuit of the resistance element 25 and the diode 22 is in series with this condenser 24.

The voltage suppressing circuits 15a and 15b may be configured by appropriately combining the circuits of the first circuit structure and the second circuit structure exemplified in FIG. 3 and FIG. 4 in parallel or in series.

OTHER EMBODIMENTS

Description has been given in the aforementioned embodiment for one example of preferable embodiments of the present invention circuit in detail. The circuit configuration of the present invention circuit is not limited to the aforementioned embodiment, and various modifications are possible without departing from the gist of the present invention. Description will be given below for other embodiments of the present invention circuit.

Figure 5:
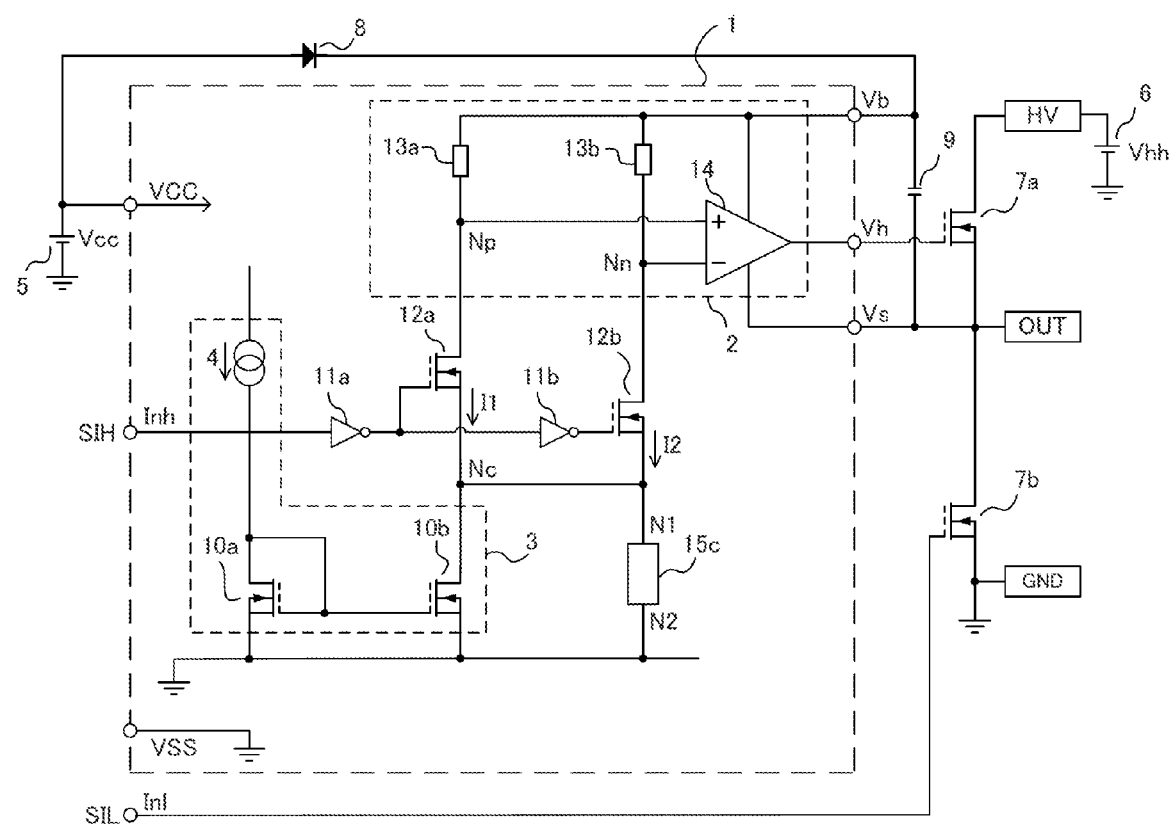
FIG. 5 is a circuit diagram showing another example of the circuit configuration of the level shift circuit according to the present invention.

<1> The current generating circuit 3 has the circuit configuration in which the MOSFETs 10b and 10c are prepared separately for the first and second current output terminals Na and Nb, respectively to generate a current flowing through each of the MOSFETs 12a and 12b independently in the aforementioned embodiment, but may have a circuit configuration in which the first and second current output terminals Na and Nb are set as one current output terminal Nc to be connected commonly to the source of each of the MOSFETs 12a and 12b as shown in FIG. 5. In this case, a second current mirror circuit including a combination of the n-type MOSFETs 10a and 10c becomes unnecessary. In this another embodiment, since there is one current output terminal Nc, a voltage suppressing circuit 15c connected thereto may be one. As the voltage suppressing circuit 15c, one of the first circuit structure or the second circuit structure described above is able to be utilized.

<2> The current generating circuit 3 is not limited to the example of the circuit configuration exemplified in FIG. 1. Any various constant current generating circuit is able to be utilized as long as being able to generate a constant current flowing through the MOSFETs 12a and 12b. For example, it may be a circuit configuration in which the current flowing through the MOSFET 10a shown in FIG. 1 is generated by using another current mirror circuit.

<3> In the aforementioned embodiment, though a voltage difference between the non-reverse input terminal Np and the reverse input terminal Nn is generated as a difference of voltage drops caused between both ends of the resistance elements 13a and 13b, that is, a different of currents flowing through the resistance elements 13a and 13b, a load circuit which causes this voltage drops (current-voltage converting circuit) is not limited to a resistance element which is a linear element and may be any two-terminal element or two-terminal circuit whose current voltage characteristics may not be linear resistance characteristics and may be non-linear current-voltage characteristics as long as an amount of the voltage drops between the both ends changes according to a magnitude of the currents. For example, diodes or transistors may be used instead of the resistance elements 13a and 13b.

<4> In the aforementioned embodiment, the MOSFETs 12a and 12b function as current control elements by which a current flowing between the drain and the source is controlled according to a gate voltage, and may be elements other than the MOSFETs as long as being elements functioning as similar current control elements, and are not necessarily required to be single element.

<5> The aforementioned embodiment has a configuration in which an in-phase input signal is input to the gate of the MOSFET 12b and a reverse phase input signal is input to the gate of the MOSFET 12a, but may have a configuration in which the reverse phase input signal is input to the gate of the MOSFET 12b and the in-phase input signal is input to the gate of the MOSFET 12a. In this case, however, since phases of the high-side input signal SIH and the high-side output signal which is output from the comparator 14 are reversed, the high-side input signal SIH and the low-side input signal SIL need to have the same phase. Moreover, in the aforementioned embodiment, the high-side input signal SIH may be used directly instead of the in-phase input signal.

<6> Moreover, a high-voltage circuit which is driven by the high-side output signal output from the comparator 14 is not limited to a circuit including the high voltage MOSFETs 7a and 7b exemplified in FIG. 1.

INDUSTRIAL APPLICABILITY

A level shift circuit according to the present invention is able to be used for a driver circuit which controls a half-bridged high-side switching element to which a high voltage is applied from a control signal with a low voltage level, and is able to be used in a wide range not only for an inverter circuit but for a level shift to a circuit having a voltage difference.

REFERENCE SIGNS LIST 1 level shift circuit according to the present invention
2 high-side circuit
3 current generating circuit
4 constant current circuit
5 voltage source
6 high-voltage source
7a, 7b n-type high voltage MOSFET
8 diode
9 condenser
10a to 10c n-type MOSFET
11a, 11b inverter
12a, 12b n-type high voltage MOSFET (first and second current control elements)
13a, 13b resistance element (first and second load circuits)
14 comparator
15a to 15c voltage suppressing circuit
21 Zener diode
22 diode
23 constant voltage source
24 condenser
25 resistance element
30 conventional level shift circuit (driver circuit)
31 pulse generating circuit
32a, 32b n-type MOSFET
33a, 33b resistance element
34 RS flip-flop
35, 41a to 41f, 43a, 43b inverter
36 high-side circuit
42a, 42b NAND circuit
44a, 44b condenser
GND: ground terminal for output of inverter circuit
HV high-voltage power source terminal of inverter circuit
IN input terminal of current control circuit
INH control input terminal of inverter circuit
INL control input terminal of inverter circuit
INV inverter circuit
Inh control input terminal, control input terminal on high-side circuit side
Inl control input terminal on low side
Nn reverse input terminal of comparator
Np non-reverse input terminal of comparator
Na first current output terminal Nb second current output terminal
Nc current output terminal
N1 first terminal of voltage suppressing circuit
N2 second terminal of voltage suppressing circuit
OUT high-voltage output terminal, output terminal of inverter circuit
OUT1, OUT2 output terminal of current control circuit
R reset terminal of RS flip-flop
S set terminal of RS flip-flop
Q output terminal of RS flip-flop
VCC circuit power source terminal, power source terminals of inverter circuit and driver circuit
VSS circuit reference terminal, ground terminals of inverter circuit and driver circuit
Vb high-side power source terminal, positive voltage power source terminal on high-side circuit side
Vh high-side output terminal, output terminal on high-side circuit side
V1 output terminal on low side
Vs high-side reference terminal, reference power source terminal on high-side circuit side

The invention claimed is:

1. A level shift circuit, comprising:
a first current control element in which a reverse-phase input signal having a reverse phase to that of an input signal is input to a control terminal and a current amount flowing between first and second terminals is controlled based on voltage of the control terminal;
a second current control element in which the input signal or an in-phase input signal which has a same phase as that of the input signal is input to a control terminal and a current amount flowing between first and second terminals is controlled based on voltage of the control terminal of the second current control element;
a first load circuit which has one end connected to a high-side power source terminal and the other end connected to the first terminal of the first current control element, and generates a voltage drop according to the current amount flowing between the first and second terminals of the first current control element;
a second load circuit which has one end connected to the high-side power source terminal and the other end connected to the first terminal of the second current control element, and generates a voltage drop according to the current amount flowing between the first and second terminals of the second current control element;
a current generating circuit which has a first current output terminal connected to the second terminal of the first current control element and a second current output terminal connected to the second terminal of the second current control element, and separately generates a current which flows through each of the first current control element and the second current control element;
a comparator in which one of a pair of differential input terminals is connected to the first terminal of the first current control element and the other of the pair of differential input terminals is connected to the first terminal of the second current control element, a power source voltage is supplied from the high-side power source terminal, and a reference voltage is supplied from a high-side reference terminal, and which generates an output signal according to a voltage difference between the pair of differential input terminals; and
a voltage suppressing circuit which is connected to the first and second current output terminals separately or commonly and suppresses a voltage rise of each of the first and second current output terminals.

2. The level shift circuit according to claim 1, wherein
the voltage suppressing circuit
is configured with a two-terminal circuit, and has one end of the two-terminal circuit connected to the first and second current output terminals separately or commonly and the other end of the second terminal circuit connected to a predetermined fixed potential, and
has, between the one end and the other end of the two-terminal circuit, at least any one of circuit structures of a first circuit structure provided with a two-terminal switching element or a two-terminal switching circuit which becomes in a conductive state when voltage between the terminals exceeds a predetermined voltage and a second circuit structure in which a capacity element having an electric capacity larger than a capacity between respective terminals between the first terminal and the second terminal of the first and second current control elements is connected to the one end of the second terminal circuit.

3. The level shift circuit according to claim 1 wherein the voltage suppressing circuit is configured by including at least one of a circuit including a single Zener diode or a series circuit of a plurality of Zener diodes, a circuit including a single diode or a series circuit of a plurality of diodes, a circuit including a series circuit of a diode and a voltage source, a circuit including a capacitance element for suppressing voltage having an electric capacitance larger than a capacitance between respective terminals between the first terminal and the second terminal of the first and second current control elements, a circuit including a series circuit of the capacitance element for suppressing voltage and a resistance element, and a circuit including a series circuit of a capacitance element for suppressing voltage and a parallel circuit of a diode and a resistance element.

4. The level shift circuit according to claim 1, further comprising:
a circuit power source terminal which receives a power source voltage for circuit operation from outside;
a diode which is provided between the circuit power source terminal and the high-side power source terminal; and
a capacitance element which is provided between the high-side power source terminal and the high-side reference terminal; wherein
the high-side reference terminal and an output terminal of a high-voltage circuit which is driven by the output signal are electrically connected.

5. The level shift circuit according to claim 1, wherein
each of the first and second current control elements is configured by a high voltage MOSFET, the control terminal of each of the first and second current control elements is a gate of the MOSFET, and the first terminal and the second terminal of the first and second current control elements are a drain and a source of the MOSFET.

* * * * *